United States Patent [19]

Arai

[11] 4,228,582
[45] Oct. 21, 1980

[54] AUTOMATIC PRODUCTION SYSTEM FOR PRINTED-WIRING BOARDS

[75] Inventor: Minoru Arai, Tokyo, Japan

[73] Assignee: Tokyo Print Industry Co., Ltd., Tokyo, Japan

[21] Appl. No.: 946,061

[22] Filed: Sep. 22, 1978

[51] Int. Cl.³ .................................................. H05K 3/00
[52] U.S. Cl. ......................................... 29/650; 29/846
[58] Field of Search ................................. 29/625, 650

[56] References Cited

U.S. PATENT DOCUMENTS

| | | | |
|---|---|---|---|
| 3,320,657 | 5/1967 | Strobel | 29/625 |
| 3,654,097 | 4/1972 | Degnan | 29/625 |

*Primary Examiner*—Gil Weidenfeld
*Attorney, Agent, or Firm*—Cushman, Darby & Cushman

[57] ABSTRACT

Provided in this invention is an automatic production system for printed-wiring boards by delivering and transferring the drilled and contoured copper-clad bases one by one successively by an automatic transfer means such as conveyor and performing the necessary treatments such as pattern printing, drying, etching, etc., automatically during transfer of the bases. The automatic printed-wiring board production system according to this invention comprises a material feeder whereby the stacked-up copper-clad bases are stored and automatically delivered onto the transfer line one by one, a pretreatment unit for performing washing, buffing and drying of the bases, first to sixth straighteners, first to fourth automatic printers, a dryer for forced-drying the printed pattern on the copper foil, an etcher for etching away the extra printed foil at other parts than the printed pattern on the copper foil, a washing means for washing away ink on the printed circuitry, first to fourth pushers, first to fourth loading stockers, first and second buffing/drying means, first and second cooling means, first and second automatic reversers, and a final finisher which gives a fluxing treatment. All of these elements are arranged in predetermined sequence along the transfer line.

12 Claims, 10 Drawing Figures

4,228,582

AUTOMATIC PRODUCTION SYSTEM FOR PRINTED-WIRING BOARDS

BACKGROUND OF THE INVENTION

This invention relates to a continuous and automatic production system for printed-wiring boards.

Heretofore, continuous and automatic production of the printed-wiring boards has been considered difficult because of necessity of many manual works in the process of production of such boards, and hence many workers have been required for each step of the production process and the production has been practiced on an intermittent or batchwise system, resulting in elevated manufacturing cost. Naturally, strong request has been voiced in the industry for the development of a continuous and automated process for production of the printed-wiring boards.

OBJECTS OF THE INVENTION

An object of this invention is to provide an automatic printed-wiring board producing system which is free of the disadvantages in the conventional systems and capable of producing the desired printed-wiring boards continuously and automatically.

Another object of this invention is to provide an automated production system capable of producing the desired printed-wiring boards with uniform quality automatically and with high efficiency.

SUMMARY OF THE INVENTION

The present invention has been deviced to comply with the said request of the industry. The system according to this invention, as described in detail later, requires no complicated manual operations, and all the component elements of the process are arranged in predetermined sequence along an automatic transfer line so that all the operations and working treatments are performed continuously and automatically, allowing continuous and automatic production of the high-quality printed-wiring boards with consistent product quality. Because of continuous and automatic performance of the entire manufacturing process, the production rate is surprisingly increased as compared with the conventional systems and also great benefits are provided to the industry in both quality and price of the products.

In the system according to this invention, there are used as starting material the copper-clad bases which have already been drilled and contoured. Structurally, the system according to this invention comprises, basically, a conventional material feeder capable of delivering the copper-clad bases onto the transfer line one by one, a conventional pretreatment mechanism for washing, buffing and drying the bases, identical conventional first to sixth straighteners, first to fourth automatic printers, a conventional dryer for forced-drying the printed pattern on the copper foil, a conventional etcher for etching away the extra printed foil other than the printed pattern area on the copper foil, a conventional washing device for washing away ink in the network, first to four pushers, first to fourth loading stockers, first and second buffing/drying means, first and second conventional cooling means, first and second automatic reversers, and a conventional final finisher for giving a fluxing treatment. The arrangement of said structural elements of this invention is as described in the Claims and as shown in the accompanying drawings.

The automatic transfer means used in the system according to this invention is preferably a conveyor, and an infrared dryer is recommended as the forced drying means for the printed pattern on the copper foil surface.

Of the first to fourth loading stockers, the first loading stocker is preferably composed of a loading stocker portion where the semi-finished copper-clad bases fed past the first pushers are tentatively retained in a stacked-up condition, a pattern checker mechanism for electrically detecting the printed circuitry on the copper-clad base delivered from said loading stocker portion, and a defective stocker where only the defective bases detected in the checker mechanism are stocked.

It is noted that the said pusher is operated in such a manner as to push the plate toward the predetermined position for accurate printing on the automatic printer.

Said first to fourth automatic printers are provided with plate fixing frames carrying the detachable printing screens arranged such that the ends of the respective screens are supported by a common pivotal shaft so as to be swingable vertically and rocker arms, said both plate fixing frames and rocker arms being preferably so arranged that they are retained in parallel relation to each other during the printing operation. Each said rocker arm is preferably so arranged that it may rock to a horizontal printing position and a non-printing position where the arm rests in an upwardly slant state, said rocking motion being effected by a cylinder mechanism through a pair of sprockets pivotted to said pivotal shaft, an endless chain passed between said sprockets and a lever integrally joined to the shaft of the lower sprocket.

Each of said first to sixth straighteners consists of a pair of vertically arranged rollers, of which the upper roller is preferably fusiform with the diameter thereof being greatest at the middle portion and gradually decreased toward both ends while the lower roller is preferably barrel-shaped with the diameter thereof being smallest at the middle portion and gradually increased toward both ends.

The first and second automatic reversers comprise a shaft rotated by a suitable power source and a pair of rotary discs mounted at both ends of said shaft, each of said rotary discs being provided with a plurality of slits cut equidistantly and radially from the peripheral edge, whereby the works are reversed in accordance with rotation of said discs and carried down onto the automatic transfer line.

Other objects and advantages of this invention will become apparent from the following detailed description of the invention and the appended claims.

DETAILED DESCRIPTION OF THE DRAWINGS

The characteristic features and specificities of the present invention will be easily understood from the following description of the preferred embodiments of the invention when taken in conjunction with the accompanying drawings. It will be noted that like reference numerals are used throughout the drawings to illustrate the similar component parts and elements.

DETAILED DESCRIPTION OF THE INVENTION

The invention is now described in detail by way of a preferred embodiment thereof with reference to the drawings.

Figure 1:
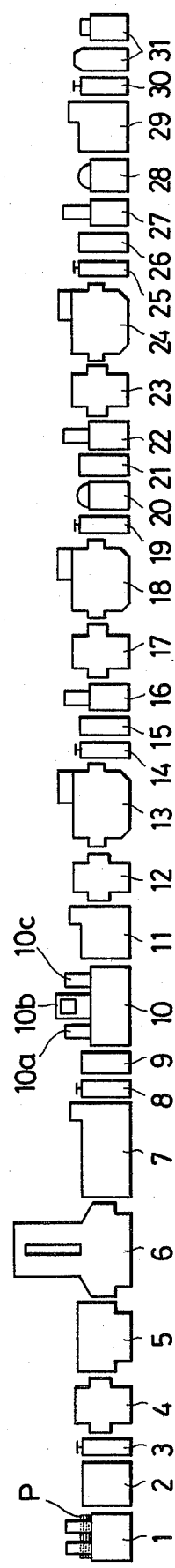
FIG. 1 is a block diagram illustrating sequentially the steps of the manufacturing process of the automatic printed-wiring board producing system according to this invention.

In FIG. 1, reference numeral 1 indicates a material feeder of conventional design comprising a mechanism for retaining in a stacked-up state the plural sheets of copper-clad bases P which have already been drilled and contoured by a suitable means such as a press and delivering out said bases one by one successively by an automatic mechanical means. Such a material feeder is manufactured by Camellia, Inc.

Figure 2:
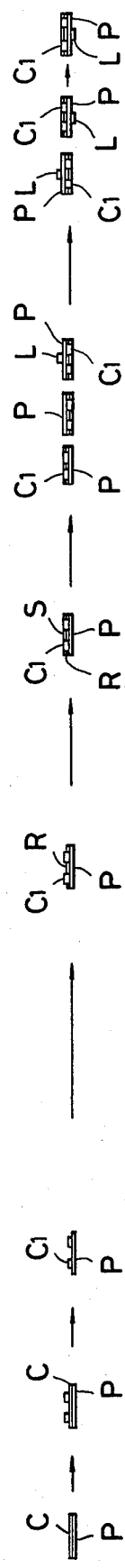
FIG. 2 is an illustration showing diagrammatically the printed-wiring board production steps in correspondence to the block diagram of FIG. 1.
Figure 3:
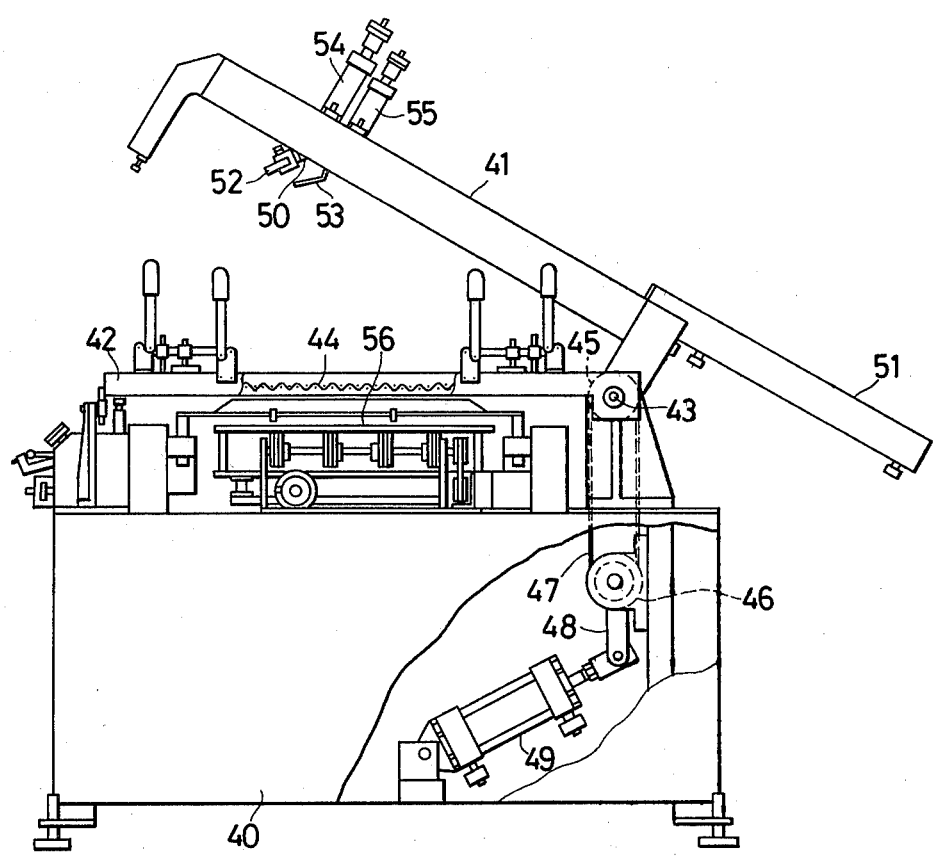
FIG. 3 is a side elevational view, with parts cut away, of an automatic printer installed in the production system according to this invention.
Figure 4:
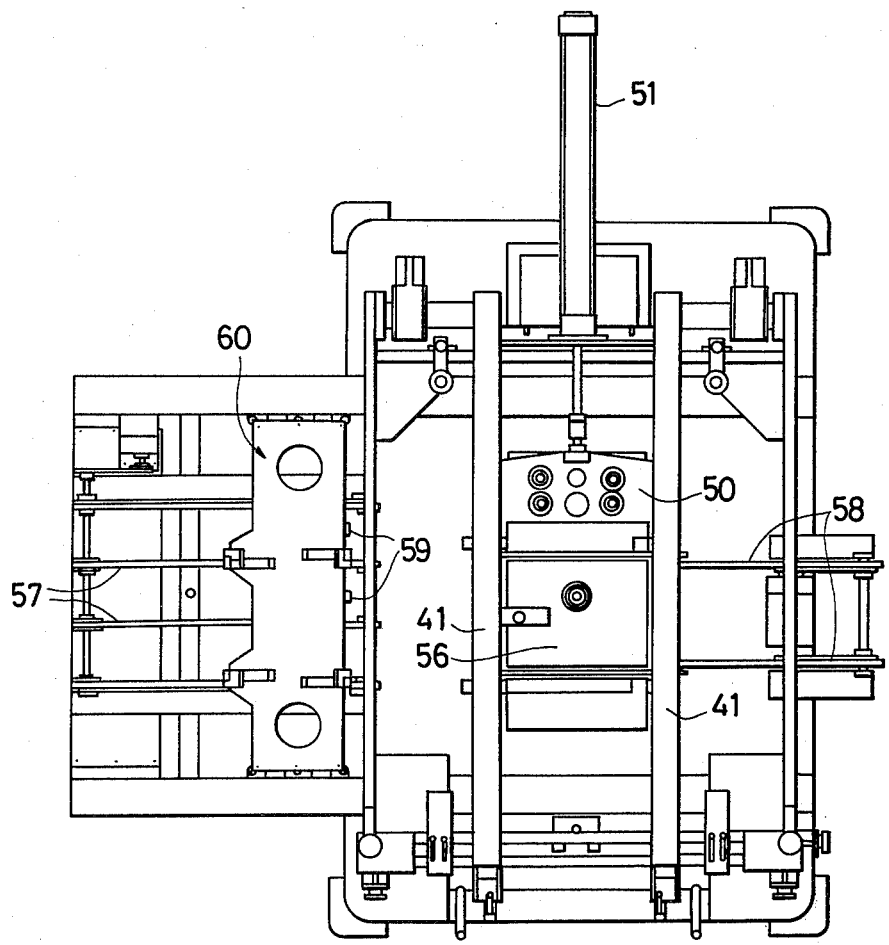
FIG. 4 is a plane view of the automatic printer shown in FIG. 3.

Each of the copper-clad bases P delivered out from said feeder 1 is carried forward by an automatic transfer means such as a conveyor. In the course of its conveyance, each said base P first passes through a pretreatment unit 2 of conventional design where it undergoes the washing, buffing and drying treatments. Such a pretreatment station is manufactured by Camellia, Inc. Then said base passes through a first straightener 3 and thence through a first automatic printer 4 whereby pattern printing is given on the surface of the copper foil C as shown in FIG. 2.

Then said copper-clad base P passes through an infrared dryer 5 of conventional design where the printed pattern on the copper foil surface is subjected to forced drying. The base is then brought into an etcher 6 where extra copper foil other than the printed pattern region on the copper foil surface is etched away to form a printed circuitry $C_1$ such as shown in FIG. 2.

The copper-clad base P which has emerged from the etcher 6 passes through a conventional washing station 7 for effecting ink separation and washing of the printed circuitry $C_1$. The base further makes its way through a second straightener 8 and a pusher 9 to move into a first stocker 10. This first stocker 10 consists of a loading stocker portion 10a where the semi-finished copper-clad bases P carried from said pusher 9 are tentatively retained in a stacked-up state, a pattern checker mechanism 10b for electrically detecting the printed circuitry $C_1$ of each base P delivered from said portion 10a, and a defective stocker portion 10c where the defectives alone of the detected bases P are stocked. The non-defective bases P alone are supplied into the ensuing conventional buffing/drying unit 11. The combination structure and operation of the elements of the stocker for carrying out the above described is generally well known.

The copper-clad base P is then carried into a second automatic printer 12 for making resist printing on the surface of the printed circuitry $C_1$ and thence further passes through a conventional cooler unit 13 for hardening the resist film R, a third straightener 14, a pusher 15 and a conventional loading stocker 16 to enter a third automatic printer 17 whereby a service map, that is, letter printing S for indicating part sign, etc., is given on the resist film R.

After the treatment in said third automatic printer 17, the base P passes through another conventional cooler unit 18 and a fourth straightener 19 to move into an automatic reverser 20.

The base P is turned over in said automatic reverser 20 and further carried forwards through a conventional pusher 21 and a loading stocker 22 into a fourth automatic printer 23 for printing a load map.

In this fourth automatic printer 23, letter printing L made on the back side of the base P comprises a load map.

The thus treated copper-clad base P is then further passed through a conventional cooler unit 24 for drying the back-side printed letters L, a fifth straightener 25, a pusher 26, a loading stocker 27, a second automatic reverser 28, a buffing dryer 29, a sixth straightener 30 and a conventional final fluxing finisher 31 and is thereby finished into the product printed-wiring board. As in indicated above, the material feeder, pretreatment station, first-sixth straighteners, first and second dryers, etcher, washing device, first and second buffing dryers, final finisher, first-sixth pushers, first-fourth stockers and first and second coolers are all of conventional design.

In a series of the just described automatic mechanical means provided along the automatic transfer line of the copper-clad bases P, the said automatic printers, 4, 12, 17 and 23 have the mechanism explained below.

As shown in FIGS. 3 to 7, the proximal end portions of a rocker arm 41 and a plate fixing frame 42 disposed therebelow are pivotally supported on the upper side of the rear portion of the underframe 40 by a pivotal shaft 43 so as to be swingable vertically. Said rocker arm 41 is provided integral with the pivotal shaft 43 while the plate fixing frame 42 is arranged pivotally movable up and down in a free state relative to the shaft 43.

A printing screen 44 is detachably held in said plate fixing frame 42, and the latter is held in position by a lock mechanism such that said frame 42 may take a position substantially parallel to the rocker arm 41.

Said rocker arm 41 is operatively connected to a cylinder mechanism 49 through a sprocket 45 secured to the shaft 43, another sprocket 46 pivotted to the underframe 40 at a lower position, an endless chain 47 passed between said both sprockets 45 and 46, and a lever 48 integrally joined to the shaft of the lower sprocket 46, whereby the rocker arm 41 is pivotally moved to take either the horizontal printing position or the upwardly slant non-printing position in accordance with the operation of said cylinder mechanism 49.

It will be also noted that a squeegee holder 50 is slidably adapted to said rocker arm 41 while maintaining an interlocked relation with the cylinder mechanism 51, said squeegee holder 50 having mounted thereto a squeegee 52 and an ink return plate 53.

Said squeegee 52 and ink return plate 53 are so designed that they can rise and fall alternately by means of the corresponding vertical cylinder mechanisms 54 and 55, respectively. Said vertical cylinder mechanisms 54 and 55 are arranged operable in correspondence to the operation of the cylinder mechanism 51 of said squeegee holder 50 such that when said squeegee holder 50 is moving in one direction by the operation of said cylinder mechanism 51, said squeegee 52 is held at its lowered position where it slides on the screen 44, and when said squeegee holder 50 is moving in the opposite direction, said ink return plate 53 is held at the lowered position. Such relative operation is actuated by a limit switch which is turned ON or OFF by the squeegee holder 50 itself when it reaches the end of its movement.

Also provided on the underframe 40 is a printing table 56 positioned immediately beneath the ink penetration area of the screen 44 held at the printing position by the rocker arm 41 through the plate fixing frame 42, and the base guide-in belts 57 and guide-out belts 58 provided separately on both sides of said printing table so as to be turned in the same direction by a motor or other means and forming a part of said automatic transfer line.

The base guide-in belts 57 are adapted to guide in the base P toward the printing table 56. At the termination of their guide-in stroke are provided the fixed stoppers 59 against which the guided base P abuts and is thereby stopped just before the printing table 56, and a chuck mechanism 60 for chucking the stopped base P and replacing it onto the printing table 56. The base guide-out belts 58 are arranged to be automatically movable vertically such that they are retained at the lowered position below the printing table 56 when printing is made on the base P and that they are raised above the printing table 56 after the printing operation to guide out the printed base P.

Figure 5:
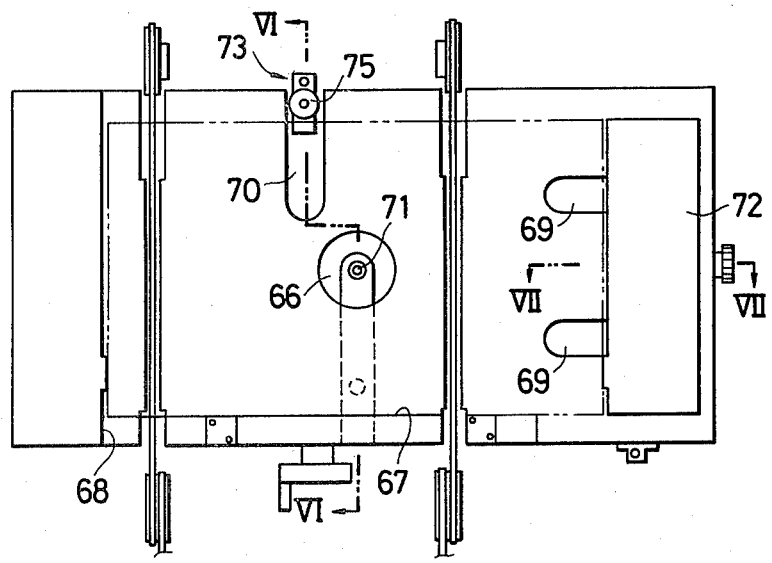
FIG. 5 is a plane view of the printing table adapted in the automatic printer shown in FIGS. 3 and 4.
Figure 6:
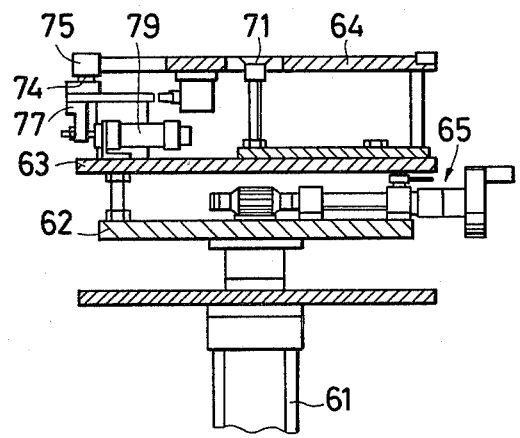
FIG. 6 is a cross-sectional view taken along the line VI—VI of FIG. 5.
Figure 7:
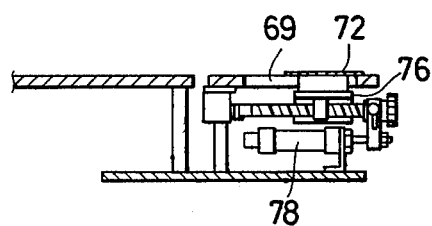
FIG. 7 is a cross-sectional view taken along the line VII—VII of FIG. 5.

The printing table 56, as best visible in FIGS. 5 to 7, consists of a lower base portion 62 disposed at the upper end of a lifting cylinder mechanism 61, an intermediate base portion 63 and an upper base portion 64 which are arranged vertically while suitably spaced apart from each other. Said intermediate and upper base portions 63 and 64 are assembled into an integral unit and arranged movable vertically above the lower base portion 62. The microadjustment for movement of the upper and intermediate base portions 64 and 63 relative to each other is effected by an operating mechanism 65 provided with a rotating handle and disposed between the lower and intermediate base portions 62 and 63.

The upper base portion 64 has at its center an opening 66 and is also provided with a fixed stopper portion 67 at its upper edge on the guide-out belt side and another fixed stopper portion 68 at the edge vertical thereto adapted to serve as a reference point for positioning of the copper-clad base P. On the sides opposite from said respective fixed stopper portions 67 and 68 are formed the elongated slots 69 and 70 which extend vertical to each other. Disposed centrally below said opening 66 is a vacuum pad 71 communicated to a suction source such as a vacuum chamber.

The upper base 64 is also provided with movable stopper members 72, 73 slidable along said respective slots 69, 70. One of the movable stopper members 72 is made from a thin metal sheet, while the other movable stopper member 73, as best illustrated in FIGS. 5 and 6, is composed of a roller 75 loosely fitted at the upper end of the vertical shaft 74. Each of said movable stopper members 72, 73 is operatively connected to a cylinder mechanism 78, 79 through a connecting member 76, 77.

Figure 8:
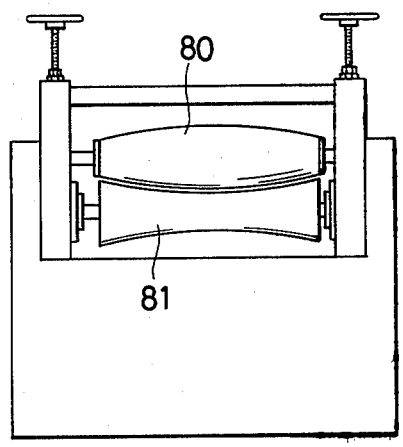
FIG. 8 is a frontal view of a base straightener.

Each of said straighteners 3, 8, 14, 19, 25 and 30 provided in said automatic transfer line is composed of a pair of vertically arranged rollers 80 and 81 as shown in FIG. 8, the upper roller 80 being spindle-shaped with its diameter being greatest at the middle portion and gradually decreased toward both ends and the lower roller 81 being barrel-shaped with its diameter being smallest at the middle portion and gradually increased toward its both ends. Said both rollers 80 and 81 are always rotating in the direction allowing passage of the copper-clad base P which has been carried on the automatic transfer line, and the base P which has passed between said rollers is divested of warp in all the directions.

Figure 9:
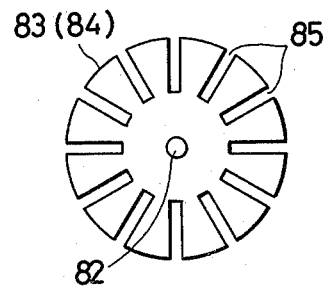
FIG. 9 is a side view of an automatic reverser.
Figure 10:
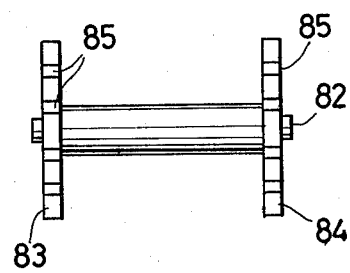
FIG. 10 is a frontal view of the automatic reverser shown in FIG. 9.

Each of the automatic reversers 20, 28, as illustrated in FIGS. 9 and 10, is composed of a pair of rotary discs 83 and 84 mounted in opposed relation on a shaft 82 connected to the power source. Each of said discs 83, 84 is formed with a plurality of slits 85 . . . cut radially from the peripheral edge so that the slits in said both discs are arranged symmetrical to each other. The copper-clad base P which was carried thereto gets into the slits 85 and is turned over in accordance with rotation of the discs 83 and 84 and brought back onto the automatic transfer in the reversed state.

According to the present invention, as described above, the entire operations are perfectly automated save for stacking-up of a plurality of already drilled and contoured copper-clad bases. Thereafter the said bases are automatically supplied from the feeder one by one successively onto the automatic transfer means such as conveyor system and automatically subjected to the pre-treatment, pattern printing, drying, etching and other necessary works while passing on the transfer line, and the completed printed-wiring board is obtained at the point where the copper-clad base has just passed the final finisher. Therefore, computer control of the production line can be adopted to realize perfect elimination of the conventional troublesome labor works and improved productivity. Further, since the copper-clad bases used as starting material can be obtained by merely drilling and contouring the so-called blank board directly by a press, there is no need of drilling the semifinished printed-wiring board to form the guide holes for the press as necessitated in the conventional devices. This can eliminate any chance of defective pressing and greatly contributes to improvement of product quality.

The foregoing description and appended drawings are merely intended to be illustrative in a way to facilitate understanding of this invention, and it will be understood that various changes and modifications can be added to the above-described arrangements without departing from the spirit of the invention.

What is claimed is:

1. An automatic production system for producing printed wiring boards in which previously drilled and contoured bases having rear surfaces and copper foil front surfaces are subjected to continuous and automatic opeations, said system comprising:
   a series of successive production elements arranged to operate on said bases in a successive order to produce said wiring boards;
   transfer means for automatically transferring said bases between each of said successive production elements;
   said successive production elements including:
   (1) means for retaining a stack of said bases and automatically delivering said bases one-by-one onto said transfer means;

(2) means, adapted to automatically receive said bases one-by-one from said transfer means, for automatically washing, buffing and drying said bases;

(3) first straightening means, adapted to automatically receive said bases one-by-one from said washing, buffing and drying means, for automatically removing warp from said bases;

(4) first printer means, adapted to automatically receive said bases one-by-one from said first straightening means, for automatically printing a printed circuit pattern on said copper foil surface of each of said bases;

(5) forced drying means, adapted to automatically receive said bases one-by-one from said first printer means, for automatically forced-drying said printed circuit pattern onto said copper foil surface of each of said bases;

(6) etching means, adapted to automatically receive one-by-one said bases from said forced drying means, for automatically removing copper foil which is not beneath said printed circuit pattern from said copper foil surface to form electrical circuits on each of said bases;

(7) washing means, adapted to automatically receive one-by-one said bases from said etching means, for automatically washing said printed circuit pattern from said bases;

(8) second straightening means, adapted to automatically receive said bases one-by-one from said washing means, for automatically removing warp from said bases;

(9) first selection means, adapted to automatically receive said bases one-by-one from said second straightening means, for automatically detecting defective electronic circuits among the electrical circuits on each of said bases and stacking the ones of said bases having defective electrical circuitry;

(10) first buffing and drying means, adapted to automatically receive from said first detecting and stocking means, those of said bases not detected as having defective electrical circuitry in said first detecting and stacking means for buffing and drying those of said bases received from said first detecting and stacking means;

(11) second printing means, adapted to automatically receive said bases one-by-one from said first buffing and drying means for automatically printing resistance material on said printed electrical circuitry;

(12) first cooling and hardening means, adapted to automatically receive said bases one-by-one from said second printing means, for cooling and hardening said resistance printing on said bases;

(13) third straightening means, adapted to automatically receive said bases one-by-one from said first cooling and hardening means, for automatically removing warp from said bases; and

(14) third printing means, adapted to automatically receive said bases one-by-one from said third straightening means, for automatically printing first indicia, corresponding to the electrical characteristics of said resistance printing such as a service map on said base;

(15) second cooling means, adapted to automatically receive one-by-one said bases from said third printing means, for cooling said bases;

(16) fourth straightening means, adapted to automatically receive said bases one-by-one from said second cooling and for automatically removing warp from said bases;

(17) first reverser means, adapted to automatically receive said bases one-by-one from said fourth straightening means, for automatically reversing the front and rear faces of said bases;

(18) fourth automatic printing means, adapted to automatically receive said bases one-by-one from said first reverser means, for printing on said rear face of said bases, second printed indicia corresponding to a load map for said electrical circuit;

(19) second drying means, adapted to automatically receive said bases one-by-one from said fourth printing means, for drying said rear face of said bases;

(20) fifth automatic straightening means, adapted to automatically receive said bases one-by-one from said second drying means, for automatically removing warp from said bases;

(21) second automatic reverser means, adapted to automatically receive said bases one-by-one from said fifth automatic straightening means, for automatically reversing the front and rear faces of said bases;

(22) second buffing and drying means, adapted to automatically receive bases one-by-one from said second reverser means, for automatically buffing and drying said bases; and

(23) fluxing finisher means, adapted to automatically receive said bases one-by-one from said second buffing and drying means, for automatically fluxing said bases to form completed printed wiring boards.

2. An automatic production system for printed-wiring boards according to claim 1 wherein said transferring means for continuously and automatically transferring said bases comprises a conveyor.

3. An automatic production system for printed-wiring boards according to claim 1, wherein said forced drying means comprises an infrared dryer.

4. An automatic production system as in claim 1 further comprising a sixth straightening means, adapted to receive said bases one-by-one from said second buffing and drying means, for automatically removing warp from said bases and transferring said bases to said fluxing finisher means.

5. An automatic production system for printed-wiring boards according to claim 1, wherein said first selection means comprises load stacking means for stacking said bases in a stacked-up state, means for automatically delivering said bases one-by-one from said second straightening means to said load stacking means, means for automatically detecting defective electrical circuitry in said bases, means for automatically delivering said bases from said load stacking means to said detecting means and second stacking means for stacking only those of aid bases having detected defective circuitry.

6. An automatic production system for printed-wiring boards according to claim 1, wherein each of said first to fourth automatic printing means comprises a supporting underframe; a plate fixing frame; a shaft pivotally mounted to said underframe; a rocker arm; said plate fixing frame carrying a detachable printing screen having an ink penetration area, said plate fixing frame having an end portion; said end portion and said rocker arm being each pivotally supported by said pivotal shaft so as to be swingable vertically; said plate fixing frame and rocker arm being so arranged that they are retained parallel to each other during the printing operation; means for swinging said rocker betwen a horizontal printing position and to an upwardly slanted non-printing position; said swinging means including a cylinder mechanism, one sprocket fitted to said pivotal shaft, another sprocket having a shaft, pivotally mounted to said underframe at a lower position, an endless chain passed between both said sprockets, and a lever integrally joined to the shaft of said lower sprocket and pivotally mounted to said cylinder mechanism; said plate fixing frame being disposable in a horizontal position for use during said printing operation.

7. An automatic production system for printed-wiring boards according to claim 6, wherein said underframe includes a printing table oriented so as to be disposed immediately below said ink penetration area of said screen when said plate fixing frame is in said horizontal position; base guide-in belts and base guide-out belts, respectively disposed at positions on opposite sides of said printing table; and driving means, such as a motor, for turning said guide-in belts and guide-out belts in a same direction for automatically transferring said bases onto and from said plate fixing frame.

8. An automatic producton system for printed-wiring boards according to claim 6 and claim 7, wherein said first to fourth automatic printers ae provided with fixed stoppers against which said bases carried by said base guide-in belts abut so that said bases are thereby stopped just before the printing table, a mechanical chuck mechanism for chucking said bases when said bases abut said fixed stoppers onto said printing table; means for retaining said base guide-out belts at the lowered position below said printing table during said base printing operation and raising said base guide-out belts above said printing table after the printing operation to deliver out said bases one-by-one.

9. An automatic production system for printed-wiring boards according to claim 6 or claim 7, wherein the printing table of said first to fourth automatic printers comprises a lifting cylinder mechanism having an upper end, a lower base mounted at said upper end of said lifting cylinder mechanism, an intermediate base member positioned above said lower base member and spaced-apart therefrom, an upper base positioned above said intermediate base member and fixed in spaced-apart relation thereto, and means for moving said intermediate and upper base members vertically above said lower base; said moving means including an operating mechanism provided between the lower and intermediate bases for making microadjustments.

10. An automatic production system for printed-wiring boards accoding to claim 4, wherein each of said first to sixth straighteners comprises a pair of vertically arranged rollers, including a spindle shaped upper roller having a diameter which is greatest at the middle portion and gradually decreases toward both ends and a barrel-shaped lower roller having a diameter which is smallest at its middle portion and gradually increases toward both ends.

11. An automatic production system for printed-wiring boards according to claim 1, wherein each of said first and second automatic reversers includes a power driven shaft and a pair of rotary discs mounted at both ends of said shaft, each of said discs being provided with a plurality of slits cut radially from the peripheral edge, for receiving said bases therein so that said bases are turned over and released therefrom with rotation of said discs.

12. An automatic production system for printed-wiring boards according to claim 8, wherein the printing table of said first to fourth automatic printers comprises a lifting cylinder mechanism having an upper end, a lower base mounted at said upper end of said lifting cylinder mechanism, an intermediate base member positioned above said lower base member and spaced-apart therefrom, an upper base positioned above said intermediate base member and fixed in spaced-apart relation thereto, and means for moving said intermediate and upper base members vertically above said lower base; said moving means including an operating mechanism provided between the lower and intermediate bases for making microadjustments.

* * * * *